United States Patent
Gao

(10) Patent No.: US 12,354,925 B2
(45) Date of Patent: Jul. 8, 2025

(54) SILICON BASED MICROCHANNEL FLUID AND THERMOELECTRIC COOLER FOR ELECTRONIC CHIPS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 318 days.

(21) Appl. No.: 17/330,552

(22) Filed: May 26, 2021

(65) Prior Publication Data

US 2022/0384295 A1 Dec. 1, 2022

(51) Int. Cl.
| | |
|---|---|
| H01L 23/36 | (2006.01) |
| H01L 23/38 | (2006.01) |
| H05K 7/20 | (2006.01) |
| H10N 10/01 | (2023.01) |
| H10N 10/13 | (2023.01) |

(52) U.S. Cl.
CPC .............. *H01L 23/36* (2013.01); *H01L 23/38* (2013.01); *H05K 7/20254* (2013.01); *H10N 10/01* (2023.02); *H10N 10/13* (2023.02)

(58) Field of Classification Search
None
See application file for complete search history.

(56) References Cited

U.S. PATENT DOCUMENTS

| | | | |
|---|---|---|---|
| 6,196,002 B1* | 3/2001 | Newman | H01L 23/38 62/3.7 |
| 2011/0226302 A1* | 9/2011 | Farmer | H10N 10/82 136/200 |
| 2012/0174956 A1* | 7/2012 | Smythe | H10N 10/17 136/201 |
| 2020/0025053 A1* | 1/2020 | Junio | H10N 10/13 |

FOREIGN PATENT DOCUMENTS

| | | | | |
|---|---|---|---|---|
| CN | 101611504 B | * | 11/2011 | ............. F02G 1/043 |
| DE | 102018130761 A1 | * | 6/2020 | |

* cited by examiner

*Primary Examiner* — Dustin Q Dam
(74) *Attorney, Agent, or Firm* — WOMBLE BOND DICKINSON (US) LLP

(57) ABSTRACT

A cold plate for cooling microchip. Fluid channels are formed in a semiconductor plate, each channel being defined by sidewalls. The sidewalls are doped with series of interchanging n-type and p-type regions, thereby generating a plurality of p-n junction in each sidewall. Electrical contacts are provided across the p-n junctions, thereby creating a plurality of thermoelectric cooling (TEC) devices within the sidewalls. Upon application of current to the contacts, the TEC devices transport and draw heat flux away from the microchip. The heat is then fully or partially collected by the cooling fluid flowing inside the channels.

19 Claims, 5 Drawing Sheets

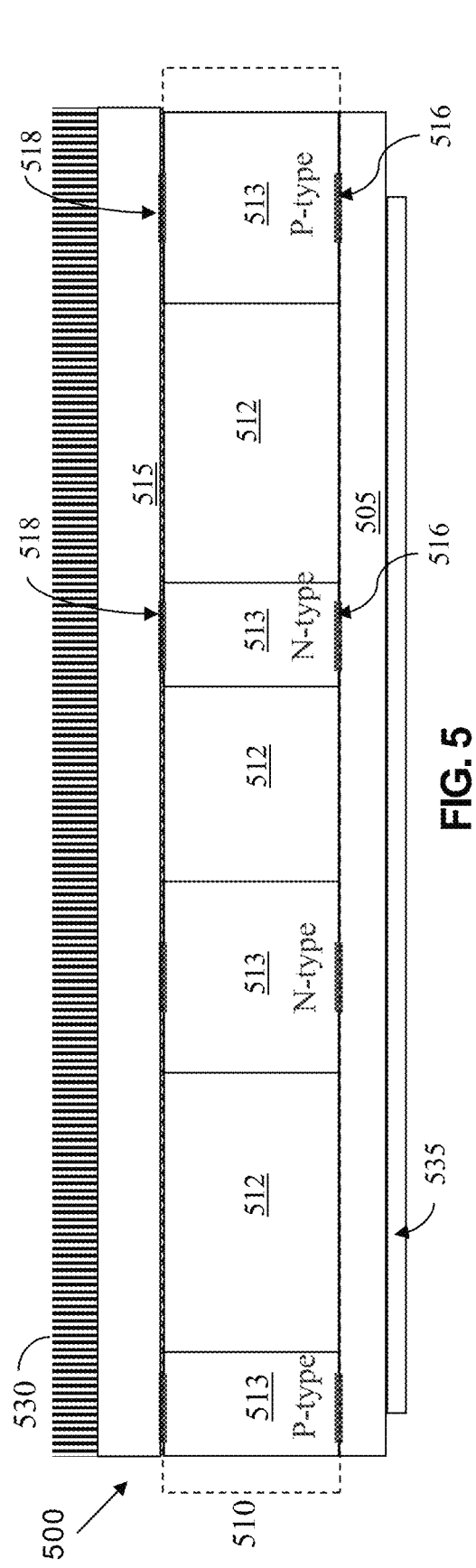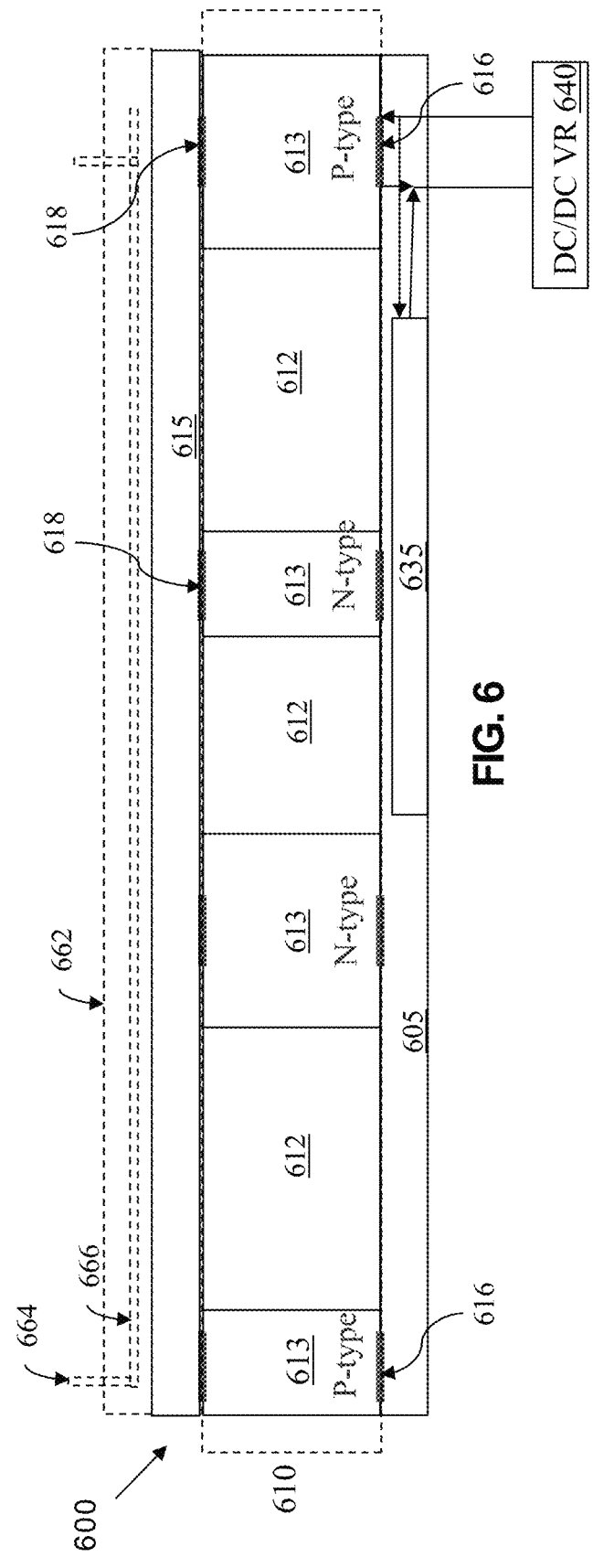

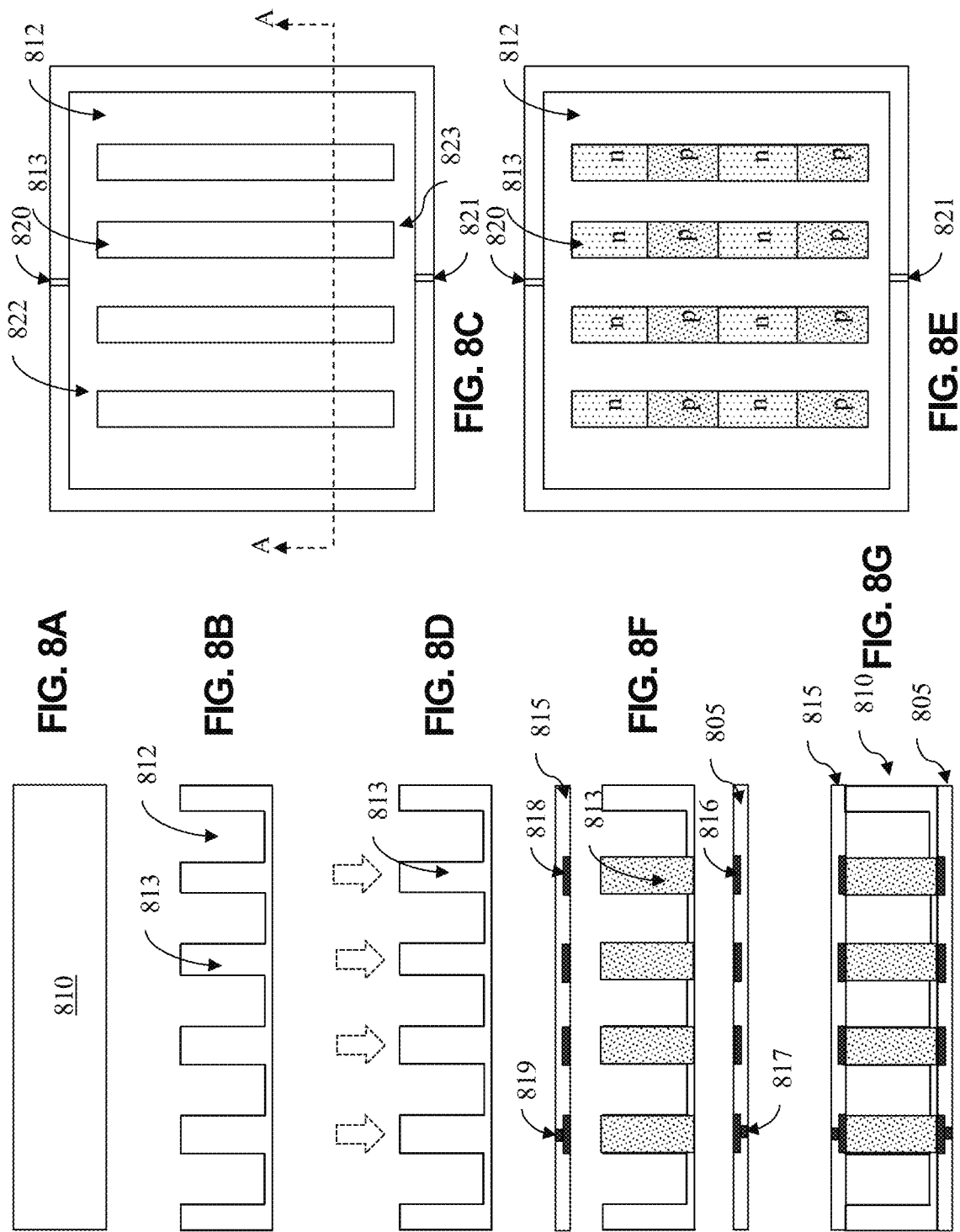

SILICON BASED MICROCHANNEL FLUID AND THERMOELECTRIC COOLER FOR ELECTRONIC CHIPS

FIELD OF THE INVENTION

Embodiments of the present invention relate generally to enhanced and reliable cooling of advanced microchips, such as microchips used in servers within data centers.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort need to be taken to ensure proper heat removal from these chips. Moreover, the liquid cooling equipment must be highly reliable, since any irregularity in heat removal may lead to loss of the chips, causing loss of available computing power during the replacement operation, and even potential impact on the service level agreement which was handled by the lost chips.

While liquid cooling solution must provide the required thermal performance and reliability, since data centers may have thousands of chips requiring liquid cooling, the cost of the liquid cooling system must remain acceptable. The cost of liquid cooling systems may include the cost of introducing redundancy to enhance reliability. Additionally, since different chips have different cooling requirements, it would be desirable to provide a cooling design that is adaptable to these different requirements.

Thermoelectric cooling (TEC) has been used in various industrial applications and consumer products. An important benefit of TEC systems is that they have no moving parts or circulating fluid, thus providing high reliability. TEC uses the Peltier effect to create a heat flux at the junction of two different types of materials, e.g., p-type and n-type semiconductors. The amount of heat flow from one side of the TEC to the other side is directly proportional to the applied DC current, such that the amount of cooling can be accurately controlled.

BRIEF DESCRIPTION OF THE DRAWINGS

Embodiments of the invention are illustrated by way of example and not limitation in the figures of the accompanying drawings in which like references indicate similar elements.

FIG. 5 illustrates a cross-sectional side view of another embodiment of the cooling plate.

FIG. 6 illustrates a cooling plate integrated with power supply of a microchip, according to an embodiment.

FIGS. 8A-8G illustrate a process for fabricating a cooling plate according to an embodiment.

DETAILED DESCRIPTION

Figure 1:
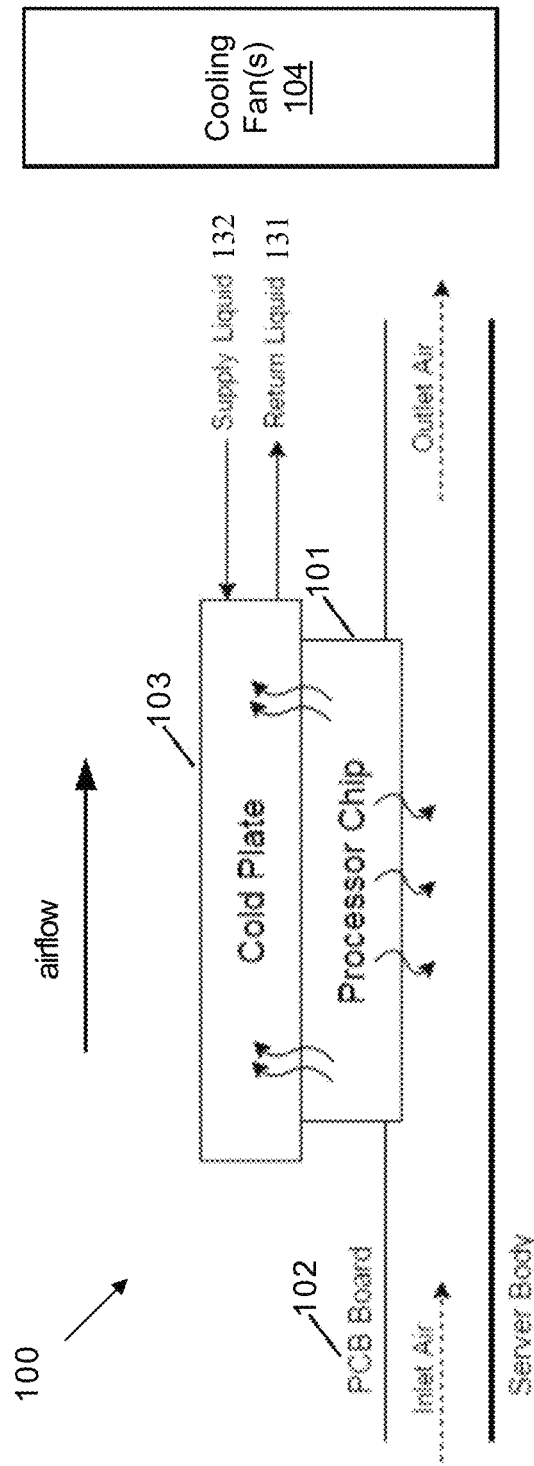
FIG. 1 is a block diagram illustrating an example of a cold plate configuration according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed embodiments provide silicon-based microchannel fluid cooling for electronic devices, which utilizes the TEC to enhance heat flow. The cooling device may be implemented for cooling various electronic devices, such as single-chip module (SCM), system on a chip (SoC), multi-chip module (MCM), System in package (SIP), etc. For brevity, these are referred to herein as microchips or simply chips, but any such reference should be understood to include any of these and similar variances of dies and packaging.

In this respect, it should be noted that in this disclosure the term "silicon-based" is used loosely as a shorthand for any kind of semiconducting material that is used in the semiconductor industry and that can be used to fabricate a p-n junction. However, since much of the semiconductor industry uses silicon to fabricate chips, much of the disclosure herein uses the term silicon. But just as other semi-conductive materials may be used to fabricate chips, e.g., silicon carbide (SiC), gallium nitride (GaN), Gallium arsenide (GaAs), etc., these material can be substituted for the cooling devices disclosed herein.

A cooling solution is disclosed which incorporates advanced chip level design. Disclosed embodiments integrate a microchannel fluid system with a semiconductor-based thermoelectric cooler. The resulting structure enables efficient cooling of high power chips. Moreover, the cooling structure may be integrated and fabricated together with the chip itself or the packaging. The disclosed designs fit well in advanced chip packaging and electronics for next generation, high power density devices. Additionally, disclosed embodiments include a semiconductor-based TEC that is co-packaged with the chip, thus enabling regulating the heat removal rate to be automatically adjusted according to the chip's power consumption. Indeed, the power for the TEC may be provided by the same power source as the chip's power. Therefore, disclosed embodiments provide a complete fluid-based cooling module that incorporate built-in TEC modules for improved and accurately controlled heat removal.

FIG. 1 is a schematic diagram illustrating a chip cold plate configuration that may be implemented or modified according to embodiments disclosed herein. The chip/cold plate assembly 100 can represent any processors/cold plate structures of servers or other computing platforms incorporating fluid cooling. Referring to FIG. 1, chip 101 is plugged onto a socket mounted on printed circuit board (PCB) or motherboard 102 coupled to other electrical components or circuits of a data processing system or server. For fluid cooling, chip 101 also includes a cold plate 103 attached to it, which is coupled to a rack manifold that is coupled to liquid supply line 132 and/or liquid return line 131, e.g., via blind mate connectors. A portion of the heat generated by chip 101 is removed by the cold plate 103. The remaining portion of the heat enters into an air space underneath or above, which may be removed by an airflow generated by cooling fan 104.

Figure 2:
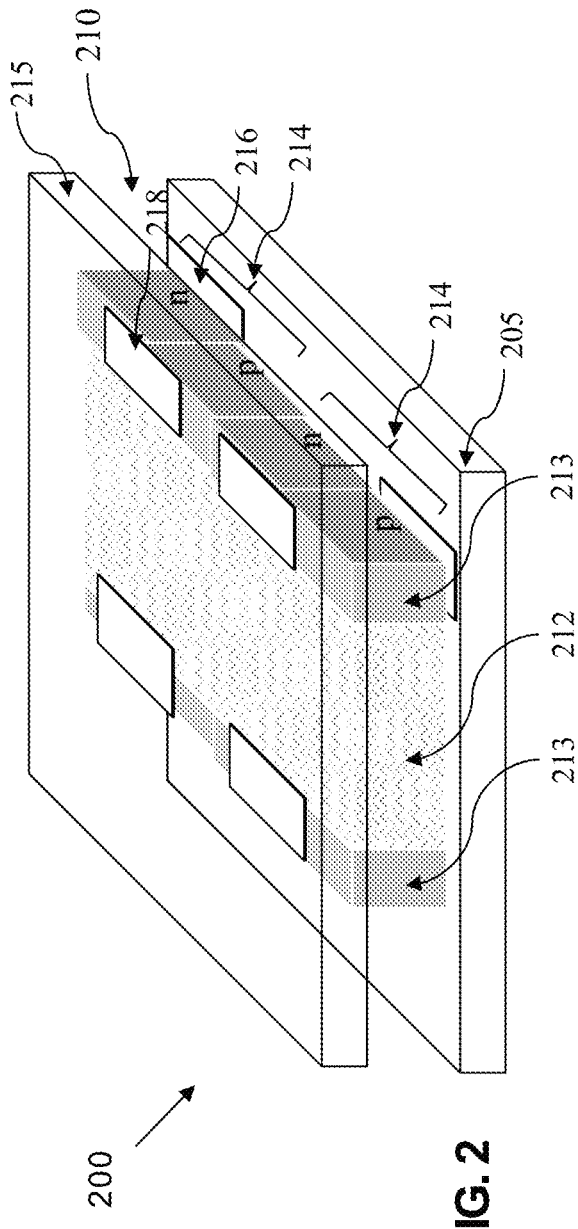
FIG. 2 is a conceptual schematic illustrating a cross-section of a cooling plate according to an embodiment.

FIG. 2 is a three-dimensional conceptual representation of a cooling assembly 200, which incorporate fluid-channel heat removal with a semiconductor-based TEC. Assembly 200 includes a bottom plate 205, a semiconductor core section 210, and a top plate 215. The bottom plate 205 and top plate 215 may also be made of semiconducting material, e.g., silicon, gallium nitride, etc. The core section 210 includes fluid channel 212, bound by two sidewalls 213, each incorporating a plurality of p-n pairs 214. A plurality of conductive contacts 216, e.g., copper patches, are formed on the bottom plate 205 and corresponding contacts 218 are formed on the top plate 215. Each p-n pair with its corresponding contacts forms a TEC that transport heat, which is then carried away by the fluid in the channel 212.

In, this embodiment, the TECs act to transfer heat from bottom plate 205 to top plate 215. Since bottom plate 205 is in physical contact with the chip (obscured in this view) the TECs generate heat flow out of the chip and transport the heat to the top plate 215. The removed heat is at least partially carried away from cooling assembly 200 by the fluid flowing in channels 212. Optionally, additional cooling mechanism may be included in, or in contact with, top plate 215, as will be shown in other embodiments below.

Incidentally, in the following embodiments similar elements are identified with similar reference numbers in the formal x ##, wherein the first digit x is replaced by the same digit as the figure number, while the next two digits ## are maintained consistent among the embodiments. Consequently, explanation of previously disclosed elements may not be repeated in subsequent embodiments.

Figure 3:
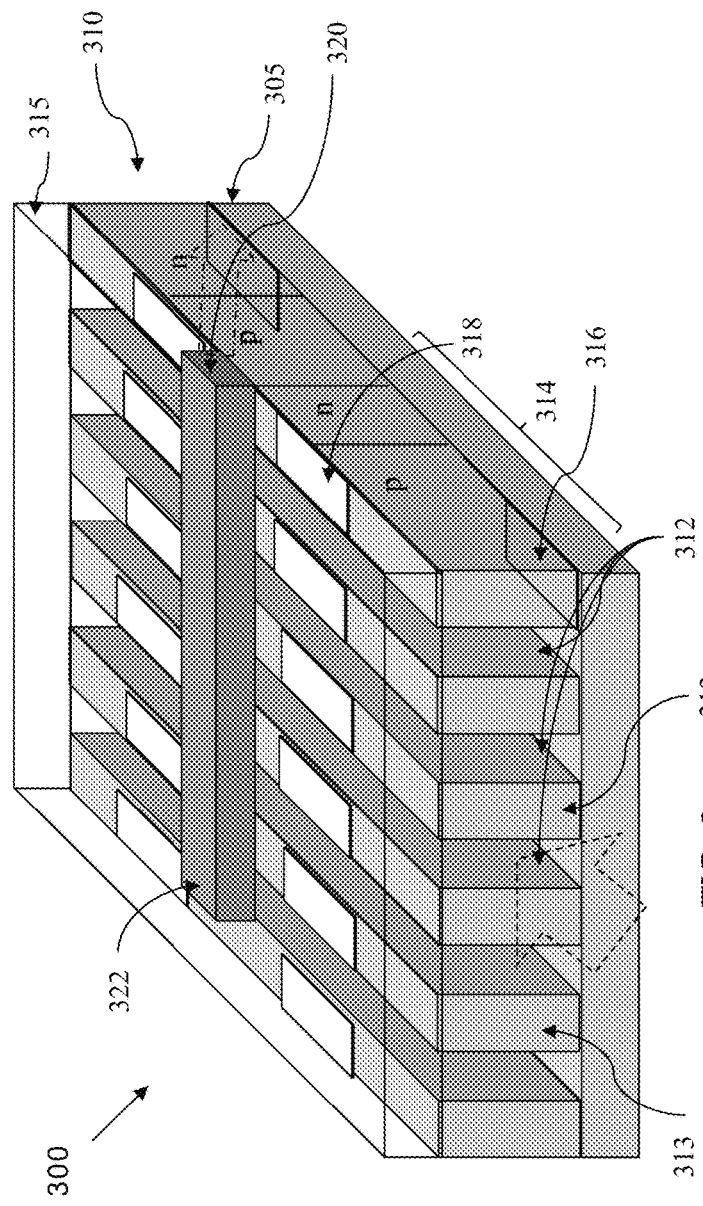
FIG. 3 illustrates an embodiment wherein a cooling device incorporates multiple fluid channels among multiple TEC structures.

FIG. 3 illustrates an embodiment wherein a cooling device 300 incorporates multiple fluid channels 312 among multiple TEC structures formed on sidewalls 313. Cooling device 300 may be made entirely of semiconducting material, e.g., silicon, and includes the bottom plate 305, core section 310 and top plate 315. A plurality of fluid channels 312 are formed in the core section, e.g., by etching a block of silicon. The fluid channels are enclosed by a plurality of sidewalls 313, each of which includes multiple TEC devices. Cooling fluid enters the cooling channels 312 from an inlet (not visible in this view) as illustrated by the dashed arrow, and flow out from outlet 320, as shown by the dash-dot arrow, after collecting heat from the multiple TEC formed in the sidewalls 313. An outlet manifold 322 may be formed in the top plate 315 to collect the fluid from all of the fluid channels 312.

As in the embodiment of FIG. 2, each of the multiple TECs 314 is made up of a pair of p-type and n-type doped blocks, with corresponding contacts 316, 318. The doped blocks may be formed by, e.g., diffusion or implant of dopants into the silicon sidewalls. The channels may be etched in silicon using wet or dry plasma etching. Consequently, the cooling plate may be fabricated using standard semiconductor fabrication techniques.

Figure 4:
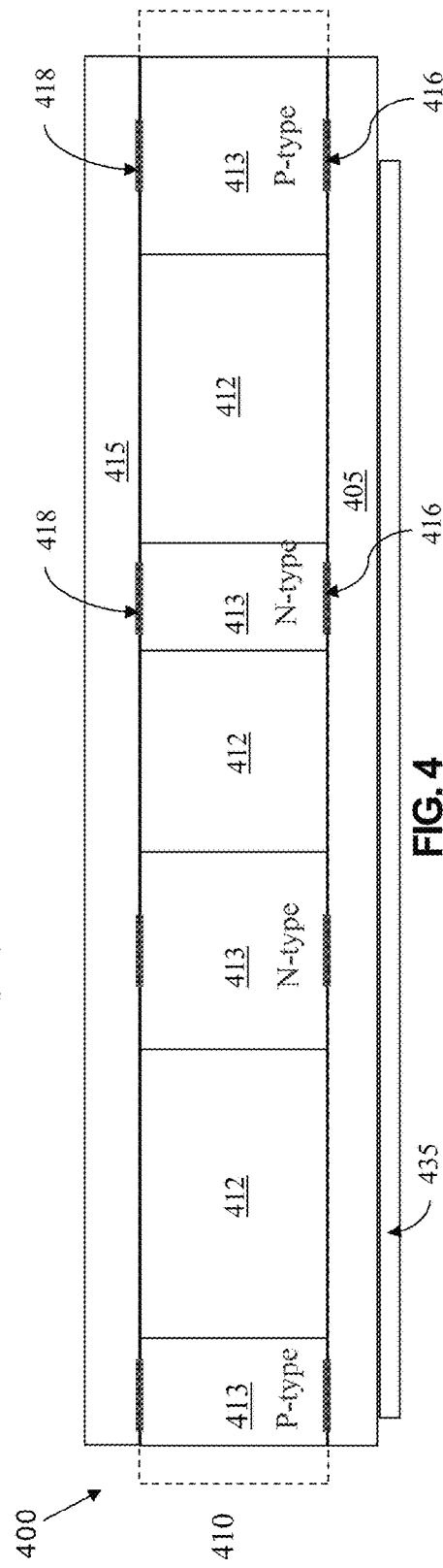
FIG. 4 illustrates an embodiment of a cooling plate that can be integrated in a 3D packaging.

The cooling plate may also be integrated as part of standard semiconductor device packaging. For example, three-dimensional integrated circuit or 3D packaging refers to integrated circuit (IC) manufactured by stacking semiconductor dies and interconnecting them vertically so that they behave as a single device to achieve performance improvements at reduced power and smaller footprint than the multiple individual two dimensional devices that would have been required to achieve the same function. The 3D packaging is one of several 3D integration schemes that exploit vertical integration to achieve electrical performance benefits. FIG. 4 illustrate an embodiment of a cooling plate that can be integrated in a 3D packaging.

FIG. 4 illustrates a side cross-section of a cooling plate or cooling device 400 that can be incorporated in a 3D packaging as one of the layers in the vertical stack. Cooling device 400 includes a bottom plate 405 and top plate 415, which may be made of semiconducting material that is compatible with the remaining semiconducting dies in the stack. The bottom plate incorporates contacts 416 and the top plate incorporates contacts 418. The core 410 incorporates the fluid channels 412 and doped sidewalls 413 which form the multiple TEC devices. The cooling plate 400 is incorporated in the packaging such that the bottom plate 405 is in physical contact with microchip 435. As microchip 435 operates and generates heat, the TEC operate to transfer the heat away from the microchip 435 by causing heat flux from bottom plate 405 to top late 415. The transferred heat is spread over the bulk of plate 415 and is then collected and removed by the fluid flowing in the channels 412.

FIG. 5 illustrates a cross-sectional side view of another embodiment of the cooling plate. This embodiment is similar to that illustrated in FIG. 4, except that the top plate 515 incorporates a secondary cooling device. The secondary cooling device enhances the heat removal as it is being transported by the TECs and the cooling fluid. In one example the secondary cooling device may incorporate fins 530, over which air may be forced by fan. Consequently, the TECs pump heat from the bottom plate 505 to the top plate 515, wherein that heat is being partially removed by the fluid flowing in channels 512 and partially removed by the air flowing over the fins 530.

FIG. 6 illustrates an embodiment that takes integration to a higher level. Generally the IC die receives a DC voltage from a DC/DC voltage regulator (VR). In disclosed embodiments the voltage to the multiple TECs in the cooling devices can be supplied by tapping into the same VR voltage, as illustrated symbolically by the arrows between the VR 640 and the contact 616 in FIG. 6 (of course, in actuality all of the contacts will be connected to the VR source, e.g., by electrical interconnects formed in the bottom and top plates). Such a feature provides automatic regulation of the amount of heat transfer by the TECs. That is, as the chip draws more current for increased processing demand, the increased current is automatically applied to the TECs by the fact that the TECs are tapped to the same current source. Naturally, as the current to the TECs increases, their heat transfer rate increases. Thus, when the chip performs intense processing and draws higher current, the TEC also automatically provide an increased rate of heat transfer.

Another feature illustrated in FIG. 6 is the integration with the chip into the bottom plate (or vice versa, the building of the cooling plate integrally with the chip die). Specifically, as illustrated in FIG. 6, the chip die 635 is integral to the bottom plate 605 of the cooling device. Since the bottom plate 605 is made of semiconductor, the chip 635 may be fabricated integrally to the bottom plate 635. This integration also provides improved power delivery of the VR power to both the chip 635 and the TECs. Moreover, in some 3D packaging the DC/DC VR 640 is also integrated into the packaging. Therefore, in such 3D packaging the integration of the chip together with the cooling device and the common connection of the chip and TECs to the VR is made very efficient.

Incidentally, the embodiment of FIG. 6 also illustrates another optional secondary heat removal device. As shown in broken line, a fluid plate 662 is provided in physical contact with the top plate 615. Fluid plate 662 incorporate fluid channels 666 with fluid ports 664. Cooling fluid is circulated inside fluid channels 666 to as to enhance heat removal from the top plate 615, in addition to the cooling fluid circulating in channels 612.

Figure 7:
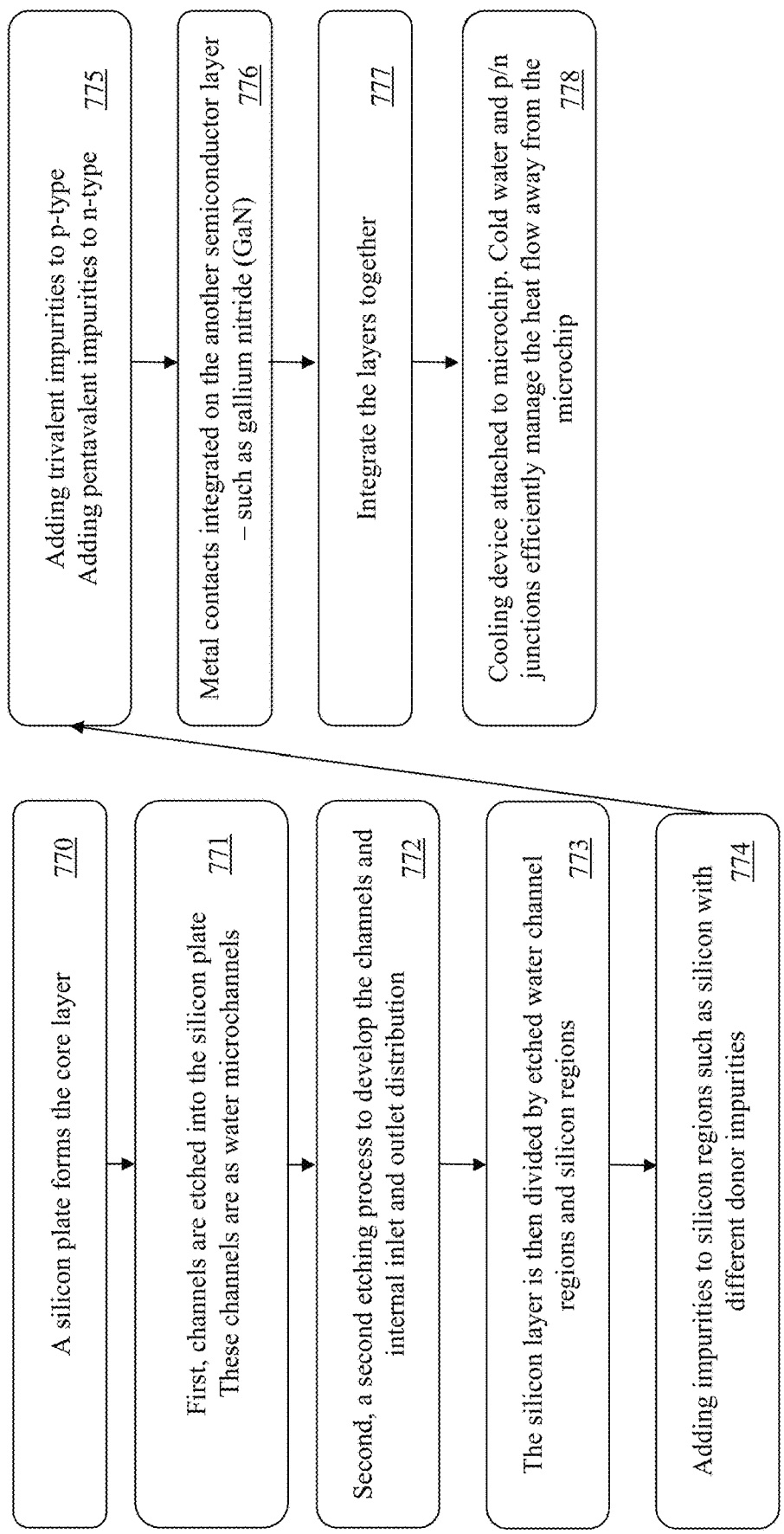
FIG. 7 is a flow chart of the general process for fabricating a cooling device according to an embodiment.

FIG. 7 is a flow chart of the general process for fabricating a cooling device according to an embodiment. At 770, a silicon plate or block is formed to function as the core layer of the device. In 771 channels are etched into the silicon plate. These etched channels form the cooling fluid microchannels. At 772, a second etch process is performed to form the inlet and outlet, and the fluid distribution manifolds. In other embodiments the two etch processes can be merged into a single etch process. Either way, at 773 the resulting core layer has channels with sidewalls, dividing the core layer into fluid channel troughs separated by silicon ridges. In 774 the silicon ridges are doped with impurities to form multiple p-n junctions. Per 775, trivalent impurities are added to regions that form p-type block and pentavalent impurities are added to regions that form the n-type blocks. At 776 semiconductor plates, e.g., GaN plates, are prepared as top and bottom layers by forming metal contacts on their surfaces. Also, appropriate circuitry to interconnect the contacts may also be fabricated on the top and bottom plates at this time. At 777 the bottom plate, core layer and top plate are assembled together (e.g., adhered) to form a cooling plate. At 778 the cooling plate is attached to a microchip, and by applying voltage to the cooling device, the p-n junctions generate heat flux away from the microchip, and the heat flux is transferred to the cold water which transport the heat out of the cooling device.

FIGS. 8A-8G illustrate a process for fabricating a cooling plate according to an embodiment, wherein FIGS. 8A, 8B, 8D, 8F and 8G are cross-sectional view along line A-A and FIGS. 8C and 8E are top views. In FIG. 8A, a plate made of semiconductor, e.g., silicon or GaN, is used for fabricating the core layer 810 of the cooling device. In FIG. 8B channels 812 are etched in the plate 810, leaving sidewalls 813. As shown in FIG. 8C, in one embodiment the etch process forms islands that function as sidewalls 813 and which define the channels 812 there-between, and additionally etches areas 823, functioning as intake manifold and area 822, functioning as outlet manifold. The intake manifold is fluidly connected to intake 821 and the outlet manifold 822 is fluidly connected to outlet 820.

In FIG. 8D a doping process is used to dope the sidewalls 813 with impurities, to thereby form n-type regions and p-type regions, as illustrated in FIG. 8E. Each pair of n-type and p-type regions form a junction of a TEC device. In FIG. 8F a bottom plate 805 and a top plate 815 are fabricated by forming contacts 816 and 818. Additionally, circuitry interconnecting the contacts may also be formed at this point, including contact point for power delivery. For example, vias 817 and 819 may be formed to connect the contacts 816 and 818 to power delivery electrodes. In FIG. 8G the bottom and top plates are attached to the core plate to form the complete cooling device.

Thus, by the disclosed embodiments, a cooling device incorporating cooling channels and thermoelectric cooling units is provided. The cooling device comprises a semiconducting slab having a plurality of fluid channels etched therein. Each of the fluid channels is surrounded by sidewalls of semiconducting material which is doped to form a plurality of p-n junctions. A plurality of contacts are provided in contact with the doped sidewalls to enable application of voltage potential to the p-n junctions, thereby functioning as multiple TECs. The cooling device is attached to a microchip or incorporated in microchip packaging, such that by application of voltage potential to the cooling device the multiple TECs generate heat flow out of the microchip, and then heat is then removed by cooling fluid flowing in the fluid channels.

According to disclosed embodiments, the cooling device is formed of a core plate having the fluid channels and the p-n junctions, a bottom plate and a top plate having contacts aligned with the p-n junctions. The bottom plate and top plate also incorporate fluid input and output ports. The cooling device may also include a fluid input and output manifolds, that may be formed in any of the bottom plate, core plate, and top plate.

According to disclosed embodiments, a method for fabricating a microchip cooling device is provided, comprising forming a plurality of fluid channels in a semiconductor plate. Doping the sidewalls of the fluid channels to form a plurality of p-n junctions. Providing electrical contacts to enable application of voltage potential to each of the p-n junctions, thus forming a plurality of thermoelectric cooling devices among the fluid channels. Cooling fluid input and output ports are formed to fluidly couple the cooling device to a liquid cooling system.

Thus, aspects of the disclosure includes a cooling plate for cooling microchips, comprising a semiconductor plate incorporating a plurality of fluid channels, wherein each of the fluid channels is defined by sidewalls, and wherein each of the sidewalls comprises n-type doped regions and p-type doped regions, wherein each pair of n-type and p-type doped regions forms a p-n junction; a fluid inlet port fluidly coupled to the fluid channels; a fluid outlet port fluidly coupled to the fluid channels; and a plurality of electrical contacts, wherein each pair of the plurality of contacts is provided across one of the p-n junctions thereby forming a thermos-electrical cooling device. An inlet manifold coupling the inlet port to the plurality of fluid channels and an outlet manifold coupling the outlet port to the fluid channels may be included. The cooling plate may be constructed of a bottom plate, a top plate, and a core plate made of semiconductor material and sandwiched between the bottom plate and the top plate, wherein the fluid channels are incorporated in the core plate and at least one of the bottom plate and the top plate is made of semiconductor material.

The plurality of electrical contacts may be formed on at least one of the bottom plate and top plate. The top plate may also incorporate a secondary cooling device, such as air cooling fins. Also, at least one of the fluid inlet port and fluid outlet ports may be formed in one of the bottom plate or the top plate and similarly at least one of the inlet manifold and outlet manifold may be formed in one of the bottom plate or the top plate. Alternatively, at least one of the inlet manifold and outlet manifold may be formed in the core plate.

According to further disclosed aspects, method for fabricating a cooling plate for microchip is provided, comprising: providing a semiconductor plate made of semiconductor material; forming a plurality of channels in the plate, each channel defined by sidewalls; doping the sidewalls by diffusing or ion implanting dopants into the sidewalls to form a series of n-type and p-type regions along each sidewall to thereby form a plurality of p-n junctions in each of the sidewalls; and forming a plurality of electrical contacts, wherein each pair of the plurality of electrical contacts is provided across one of the p-n junctions. Forming the plurality of channels may be done by wet or dry etching of the semiconductor plate. Forming the plurality of electrical contacts may be done by forming the contacts on at least one of a bottom plate and top plate and attaching both the bottom plate and the top plate to the semiconductor plate. The method may include forming an inlet port and an outlet port in at least one of the bottom plate and top plate, which may be made of semiconductor material. A semiconductor device may be placed in contact with or integrated in the bottom plate, and the plurality of contacts may be coupled to a power source of the semiconductor device.

Yet further disclosed aspects include a cooling plate integrated in a microchip packaging, comprising: a semiconductor plate incorporating a plurality of fluid channels, wherein each of the fluid channels is defined by sidewalls, and wherein each of the sidewalls comprises n-type doped regions and p-type doped regions, wherein each pair of n-type and p-type doped regions forms a p-n junction; a fluid inlet port fluidly coupled to the fluid channels; a fluid outlet port fluidly coupled to the fluid channels; a plurality of electrical contacts, wherein each pair of the plurality of contacts is provided across one of the p-n junctions thereby forming a thermos-electrical cooling device; a microchip in physical contact with the semiconductor plate; and power lines coupled in parallel to the microchip and the plurality of electrical contacts.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate for cooling microchips, comprising:
   a core plate made of semiconductor material incorporating a plurality of fluid channels, wherein each of the plurality of fluid channels is defined by sidewalls, and wherein each of the sidewalls comprises n-type doped regions and p-type doped regions, wherein each pair of n-type and p-type doped regions forms a p-n junction;
   a fluid inlet port fluidly coupled to the plurality of fluid channels;
   a fluid outlet port fluidly coupled to the plurality of fluid channels; and,
   a plurality of electrical contacts, wherein each pair of the plurality of electrical contacts is provided across one of the p-n junctions thereby forming a thermos-electrical cooling device, wherein the thermos-electrical cooling device is configured to cool a microchip;
   power lines coupled in parallel to each pair of the plurality of electrical contacts and the microchip to automatically adjust a rate of heat transfer of the thermos-electrical cooling device based on power consumption of the microchip; and
   a bottom plate and a top plate,
   wherein the core plate is sandwiched between the bottom plate and the top plate, such that of the plurality of fluid channels are further defined by the top plate and the bottom plate.

2. The cooling plate of claim 1, further comprising an inlet manifold coupling the fluid inlet port to the plurality of fluid channels and fluid outlet manifold coupling the outlet port to the fluid channels.

3. The cooling plate of claim 1, wherein at least one of the bottom plate and the top plate is made of semiconductor material.

4. The cooling plate of claim 1, wherein the plurality of electrical contacts are formed on at least one of the bottom plate and top plate.

5. The cooling plate of claim 1, wherein the top plate comprises a secondary cooling device.

6. The cooling plate of claim 5, wherein the secondary cooling device comprises fins formed on the top plate.

7. The cooling plate of claim 2, wherein at least one of the fluid inlet port and fluid outlet ports is formed in one of the bottom plate or the top plate.

8. The cooling plate of claim 7, wherein at least one of the inlet manifold and outlet manifold is formed in one of the bottom plate or the top plate.

9. The cooling plate of claim 7, wherein at least one of the inlet manifold and outlet manifold is formed in the core plate.

10. A cooling plate integrated in a microchip packaging, comprising:
   a core plate made of semiconductor material incorporating a plurality of fluid channels, wherein each of the plurality of fluid channels is defined by sidewalls, and wherein each of the sidewalls comprises n-type doped regions and p-type doped regions, wherein each pair of n-type and p-type doped regions forms a p-n junction;
   a fluid inlet port fluidly coupled to the plurality of fluid channels;
   a fluid outlet port fluidly coupled to the plurality of fluid channels;
   a plurality of electrical contacts, wherein each pair of the plurality of electrical contacts is provided across one of the p-n junctions thereby forming a thermos-electrical cooling device;
   a microchip in physical contact with a bottom plate;
   power lines coupled in parallel to the microchip and each pair of the plurality of electrical contacts to control a rate of heat transfer of the thermos-electrical cooling device based on current draw of the microchip; and
   a top plate,
   wherein the core plate is sandwiched between the bottom plate and the top plate, such that of the plurality of fluid channels are further defined by the top plate and the bottom plate.

11. The cooling plate of claim 1, wherein the thermos-electrical cooling device transfers heat from the bottom plate to the top plate.

12. The cooling plate of claim 10, further comprising an inlet manifold coupling the fluid inlet port to the plurality of fluid channels and outlet manifold coupling the fluid outlet port to the fluid channels.

13. The cooling plate of claim 10, wherein at least one of the bottom plate and the top plate is made of semiconductor material.

14. The cooling plate of claim 10, wherein the plurality of electrical contacts are formed on at least one of the bottom plate and top plate.

15. The cooling plate of claim 10, wherein the top plate comprises a secondary cooling device.

16. The cooling plate of claim 15, wherein the secondary cooling device comprises fins formed on the top plate.

17. The cooling plate of claim 12, wherein at least one of the fluid inlet port and fluid outlet ports is formed in one of the bottom plate or the top plate.

18. The cooling plate of claim 17, wherein at least one of the inlet manifold and outlet manifold is formed in one of the bottom plate or the top plate.

19. The cooling plate of claim 10, wherein the thermos-electrical cooling device transfers heat from the bottom plate to the top plate.

\* \* \* \* \*